United States Patent
Park et al.

(10) Patent No.: US 8,673,724 B2
(45) Date of Patent: Mar. 18, 2014

(54) METHODS OF FABRICATING SEMICONDUCTOR DEVICES

(75) Inventors: Sang-Jine Park, Yongin-si (KR);
Kee-Sang Kwon, Seoul (KR);
Doo-Sung Yun, Suwon-si (KR); Bo-Un Yoon, Seoul (KR); Jeong-Nam Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/561,245

(22) Filed: Jul. 30, 2012

(65) Prior Publication Data
US 2013/0115759 A1    May 9, 2013

(30) Foreign Application Priority Data
Nov. 4, 2011    (KR) .................... 10-2011-0114630

(51) Int. Cl.
*H01L 21/336*    (2006.01)

(52) U.S. Cl.
USPC  438/300; 257/369; 257/E21.43; 257/E21.438; 257/E21.642; 438/197; 438/199; 438/221; 438/296; 438/299; 438/303; 438/630; 438/664

(58) Field of Classification Search
USPC ............ 257/369, E21.43, E21.438, E21.642; 438/197, 199, 221, 296, 299, 300, 303, 438/630
See application file for complete search history.

(56) References Cited

U.S. PATENT DOCUMENTS

| | | | |
|---|---|---|---|
| 2007/0026593 A1 | 2/2007 | Jawarani et al. | |
| 2007/0132035 A1* | 6/2007 | Ko et al. | 257/374 |
| 2008/0145986 A1* | 6/2008 | Chidambarrao et al. | 438/199 |
| 2010/0006907 A1 | 1/2010 | Itokawa | |

FOREIGN PATENT DOCUMENTS

JP    2000-031480    1/2000

* cited by examiner

*Primary Examiner* — Asok K Sarkar
(74) *Attorney, Agent, or Firm* — Myers Bigel Sibley & Sajovec, P.A.

(57) ABSTRACT

Provided are methods of fabricating a semiconductor device that include providing a substrate that includes a first region having a gate pattern and a second region having a first trench and an insulating layer that fills the first trench. A portion of a sidewall of the first trench is exposed by etching part of the insulating layer and a first spacer is formed on a sidewall of the gate pattern. A second spacer is formed on the exposed sidewall of the first trench, wherein the first spacer and the second spacer are formed simultaneously.

20 Claims, 17 Drawing Sheets

METHODS OF FABRICATING SEMICONDUCTOR DEVICES

This application claims priority from Korean Patent Application No. 10-2011-0114630 filed on Nov. 4, 2011 in the Korean Intellectual Property Office, the disclosure of which is incorporated herein by reference in its entirety.

BACKGROUND

The present inventive concept relates to methods of fabricating semiconductor devices.

With the development of electronic technology, various technologies are being developed to increase the operation speed of semiconductor devices. One of the technologies is to increase the speed of electrons or holes by applying tensile or compressive stress to an active region. Various research has been conducted to solve reliability problems that may arise from the application of these technologies.

In order to increase the operation speed of a semiconductor device, a portion of an active region is recessed, and a semiconductor pattern having a different lattice constant from a substrate is grown in the recessed portion. When the semiconductor pattern is grown in the recessed portion, the growth direction and rate of the semiconductor pattern vary according to whether a material is present at an edge of the recessed portion. That is, if there is not a sidewall at the edge of the recessed portion, the semiconductor pattern may not grow at the edge of the recessed portion. In this case, it may occur that contact is not open when the contact is formed on the semiconductor pattern in the recess portion. In addition, a silicide film may not grow flat during a silicide process but may grow along a boundary of a device isolation region. Therefore, a distance between the contact and a junction may be reduced, causing junction leakage of the semiconductor device.

SUMMARY

Aspects of the present inventive concept provide methods of fabricating semiconductor devices in which a spacer for helping the growth of a semiconductor pattern on a sidewall of a device isolation region may be formed.

Aspects of the present inventive concept also provide methods of fabricating semiconductor devices including the spacer.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

Methods of fabricating a semiconductor device may include providing a substrate which comprises a first region having a gate pattern and a second region having a first trench and a first insulating layer which fills the first trench, exposing a portion of a sidewall of the first trench by etching part of the first insulating layer, and forming a second insulating layer on the substrate and forming a first spacer on a sidewall of the gate pattern and a second spacer on the exposed sidewall of the first trench by etching the second insulating layer, the first layer and the second layer being formed substantially simultaneously.

In some embodiments, the second spacer is an etch-resistant material having an etch selectivity with respect to the insulating layer. Some embodiments provide that a height of the exposed portion of the sidewall of the first trench is in a range of 10 to 400 Å. In some embodiments, exposing the portion of the sidewall of the first trench further comprises forming a dent in the second insulating layer that contacts the first region. Some embodiments provide that a top surface of the second insulating layer is substantially flat after the portion of the sidewall of the first trench is exposed.

Some embodiments include forming a second trench by etching the first region on each of both sides of the gate pattern, forming a semiconductor pattern in the second trench, and forming a silicide film on the semiconductor pattern that contacts the second spacer and is separated from the insulating layer. Some embodiments further include, between forming the semiconductor pattern and forming the silicide film, forming an interlayer insulating layer on the substrate, and forming an interlayer insulating pattern having an aperture on the semiconductor pattern by etching the interlayer insulating layer. In some embodiments, forming the silicide film comprises forming the silicide film in the aperture.

In some embodiments, the interlayer insulating layer is formed to substantially fill the first trench. Some embodiments include forming an interlayer insulating pattern having an aperture on the silicide film, wherein a contact is formed in the aperture. In some embodiments, the semiconductor pattern is a monocrystalline epitaxial layer. Some embodiments provide that the semiconductor pattern includes a first material that includes a first lattice constant and the substrate includes a second material that includes a second lattice constant that is different from the first lattice constant. In some embodiments, the substrate is a silicon substrate, and the semiconductor pattern is one of SiGe and/or SiC. Some embodiments provide that a boundary surface between the semiconductor pattern and the insulating layer does not contact the silicide film.

According to some embodiments, methods of fabricating a semiconductor device may include providing a substrate that comprises a first region having a gate pattern and a second region having a first trench and an insulating layer which fills the first trench, exposing a portion of a sidewall of the first trench by etching part of the insulating layer, and forming a first spacer on a sidewall of the gate pattern and forming a second spacer on the exposed sidewall of the first trench. Some embodiments provide that the first spacer and the second spacer are formed simultaneously.

In some embodiments, the etch-resistant material is one of SiN, SiON, SiCN, and a combination of these materials. Some embodiments include forming a second trench by etching the first region on each of both sides of the gate pattern, forming a semiconductor pattern in the second trench, forming an interlayer insulating layer on the substrate, forming an interlayer insulating pattern having an aperture on the semiconductor pattern by etching the interlayer insulating layer and forming a silicide film on the semiconductor pattern.

In some embodiments, the silicide film contacts the second spacer and is separated from the first insulating layer. Some embodiments provide that the interlayer insulating layer is formed to completely fill the first trench. In some embodiments, the interlayer insulating layer is formed to completely fill the first trench and a boundary surface between the semiconductor pattern and the insulating layer does not contact the silicide film.

In some embodiments, the second insulating layer is an etch-resistant material having an etch selectivity with respect to the first insulating layer.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other aspects and features of the present inventive concept will become more apparent by describing in detail exemplary embodiments thereof with reference to the attached drawings.

DETAILED DESCRIPTION OF THE EMBODIMENTS

Figure 1:
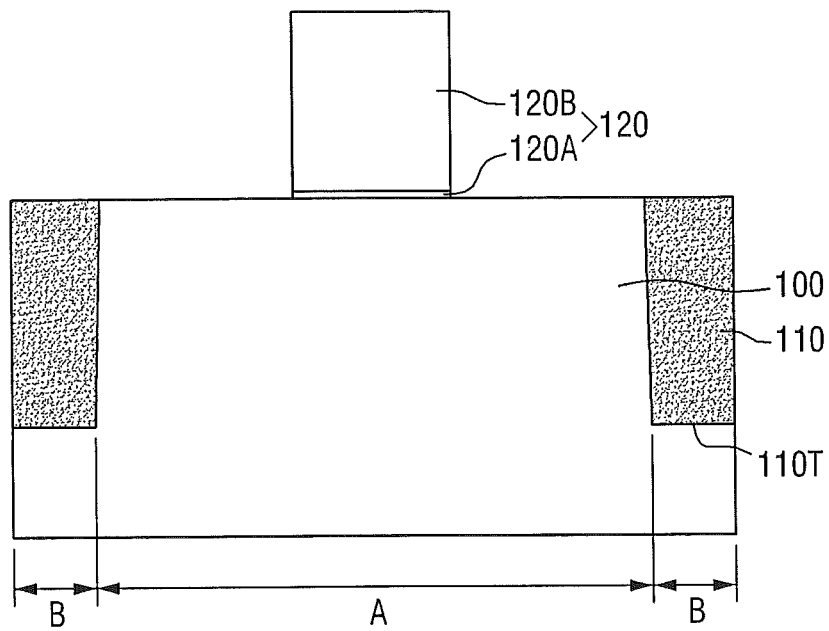
FIGS. 1 through 4 are cross-sectional views respectively illustrating processes included in methods of fabricating a semiconductor device according to some embodiments of the present inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

Hereinafter, methods of fabricating a semiconductor device according to some embodiments of the present inventive concept will be described with reference to FIGS. 1 through 4. Specifically, a method of forming a second spacer which helps the growth of a semiconductor pattern in a first region will be described.

FIGS. 1 through 4 are cross-sectional views respectively illustrating processes included in methods of fabricating a semiconductor device according to some embodiments of the present inventive concept.

Referring to FIG. 1, a substrate 100 includes a first region A and a second region B. A gate pattern 120 may be formed on the first region A of the substrate 100. In addition, a first trench 110T and a first insulating layer 110, which fills the first trench 110T, may be formed in the second region B of the substrate 100.

The first region A may be an active region of a semiconductor device, and the semiconductor device may be, for example, a logic device and/or a memory device. The gate pattern 120 on the first region A includes a gate insulating film 120A and a gate electrode 120B. Specifically, the substrate 100 may be a bulk silicon substrate and/or a silicon-on-insulator (SOI) substrate. Otherwise, the substrate 100 may be a silicon substrate and/or a substrate made of another material such as silicon germanium, indium antimonide, lead telluride, indium arsenide, indium phosphide, gallium arsenide, and/or gallium antimonide, among others. However, the material that forms the substrate 100 is not limited to the above materials.

The gate insulating film 120A may be made of an oxide film, SiON, GexOyNz, GexSiyOz, a high-k material, a combination of these materials, and/or a sequential stack of these materials. Examples of the high-k material may include, but are not limited to, $HfO_2$, $ZrO_2$, $Al_2O_3$, $Ta_2O_5$, hafnium silicate, zirconium silicate, and/or a combined film of these materials.

The gate electrode 120B may be, but is not limited to, a single film of poly-Si, poly-SiGe, poly-Si doped with impurities, metal such as Ta, TaN, TaSiN, TiN, Mo, Ru, Ni or NiSi, and/or metal silicide, or a stacked film of these materials.

Although not shown in FIG. 1, a hard mask film may be formed on the gate electrode 120B to protect the gate electrode 120B. Here, the hard mask film may be made of SiN or SiON. In addition, a gate spacer (not shown), which protects the gate pattern 120, may be formed on a side surface of the gate pattern 120. The gate spacer may include, but is not limited to, a nitride film and/or an oxide film.

In FIG. 1, the second region B may be a device isolation region. The first trench 110T may be formed in the second region B and may be filled with the first insulating layer 110. The first insulating layer 110 may be formed by a chemical vapor deposition (CVD) process using, for example, silicon oxide. To better insulate devices from each other, the first insulating layer 110 may include a trench insulating film (not shown) and a trench liner (not shown).

Figure 2A:
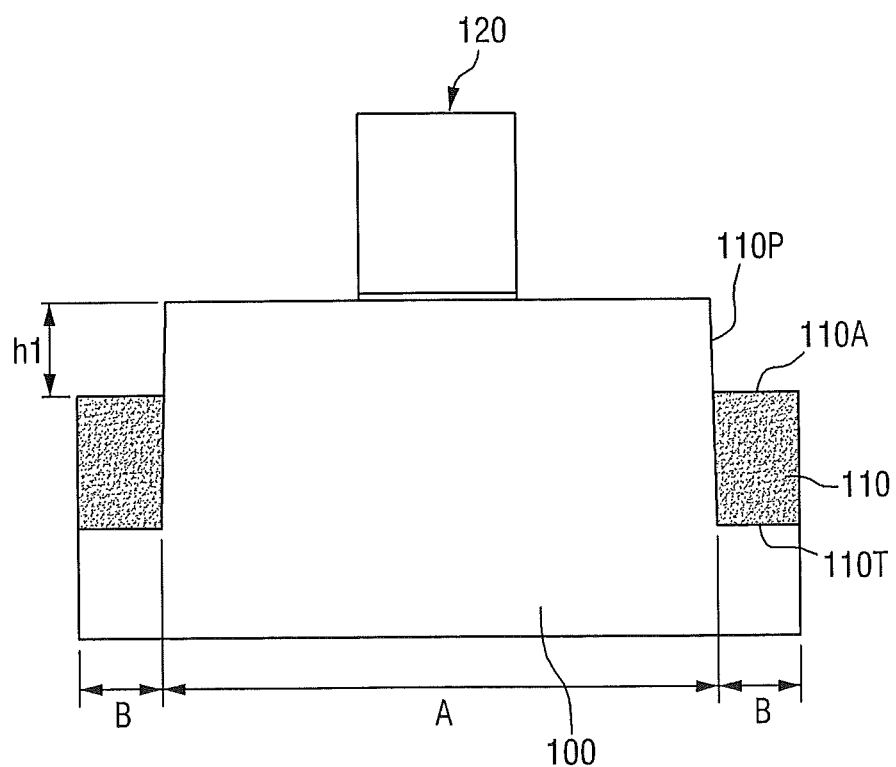
Figure 2B:
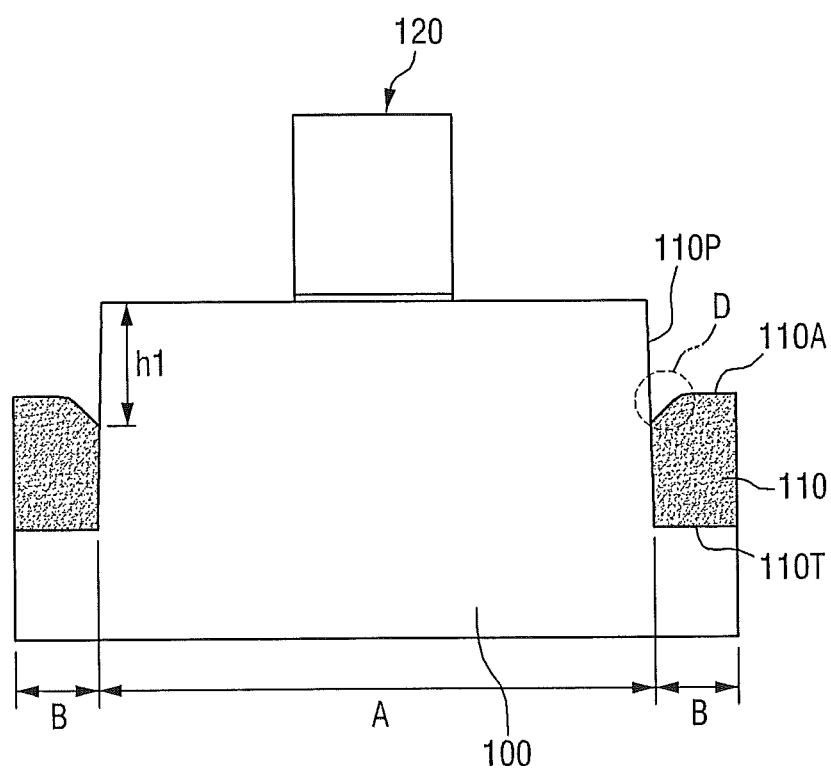

Referring to FIGS. 2A and 2B, a portion 110P of a sidewall of the first trench 110T may be exposed by etching part of the first insulating layer 110 in the first trench 110T. Here, part of the first insulating layer 110 may be etched by a dry etching process, a wet etching process, or a combination of these processes. A length h1 of the portion 110P of the sidewall of the first trench 110T, which is exposed by the etching process, may be in a range of about 10 to 400 Å. Specifically, if the length h1 of the exposed portion 110P of the sidewall of the first trench 110T is less than about 10 Å, a second spacer, which is to be formed on the exposed sidewall of the first trench 110T by a subsequent process, may be etched and thus removed by a process. That is, since an etch selectivity exists between materials, the second spacer may be etched and thus removed by an etching process performed after the second spacer is formed. If the length h1 of the exposed portion 110P of the sidewall of the first trench 110T is more than about 400 Å, a thickness of the first insulating layer 110 formed for insulation between devices may be reduced. The first insulating layer 110 with a reduced thickness may not sufficiently insulate devices from each other, thus increasing leakage current between the devices and deteriorating device characteristics.

Referring to FIG. 2A, a top surface 110A of the first insulating layer 110 is substantially flat. Specifically, after part of the first insulating layer 110 in the first trench 100T is etched by a dry etching process, the top surface 110A of the first insulating layer 110 may be substantially flat. That is, an etching gas for the first insulating layer 110 may uniformly etch the first insulating layer 110, thereby removing part of the first insulating layer 110. Thus, the top surface 110A of the first insulating layer 110 exposed by the etching process may be substantially flat.

Referring to FIG. 2B, a dent D is formed in the top surface 110A of the first insulating layer 110. That is, the dent D may be formed in a boundary portion of the first insulating layer 110 which contacts the first region A. Specifically, the dent D may be formed in the boundary portion of the first insulating layer 110, which contacts the first region A, when part of the first insulating layer 110 in the first trench 110T is etched by a wet etching process and/or a combination of the wet etching process and a dry etching process. The material that forms the first region A of the substrate 100 may be different from the material that forms the first insulating layer 110 in the first trench 110T. When the two materials combine, interface energy may increase at a boundary surface between the substrate 100 and the first insulating layer 110. Accordingly, the boundary surface may become unstable in terms of energy. Since the wet etching process is a process of etching a material through a chemical reaction using a chemical material, etching may occur actively in a region which is unstable in terms of energy. Therefore, etching may occur actively at the boundary surface between the substrate 100 and the first insulating layer 110, which is unstable in terms of energy. Consequently, the dent D may be formed in the boundary portion of the first insulating layer 110 that contacts the first region A.

In FIG. 2B, the dent D may slope upward at a continuous angle for a certain distance. However, the shape of the dent D is not limited to this shape. For example, the top surface 110A of the first insulating layer 110 may be flat in the boundary portion of the first insulating layer 110, which contacts the first region A, and then may slope downward at a continuous angle for a certain distance. These shapes of the dent D can be achieved by a combination of a dry etching process and a wet etching process.

In methods of fabricating a semiconductor device according to the current embodiments of the present inventive concept, a case where the top surface 110A of the first insulating layer 110 is substantially flat as shown in FIG. 2A is described. However, the present inventive concept is not limited to this case.

Figure 3:
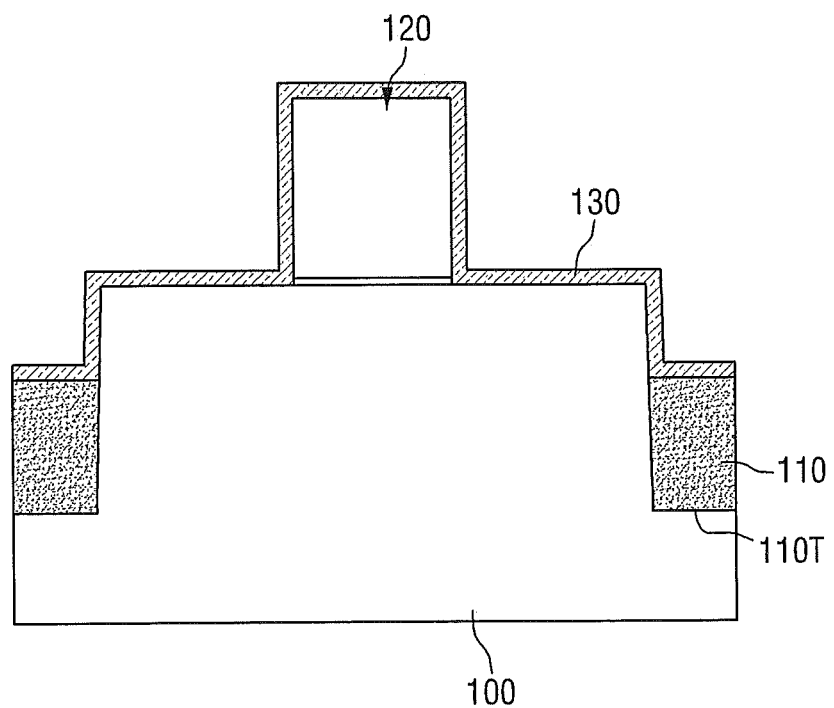
Figure 4:
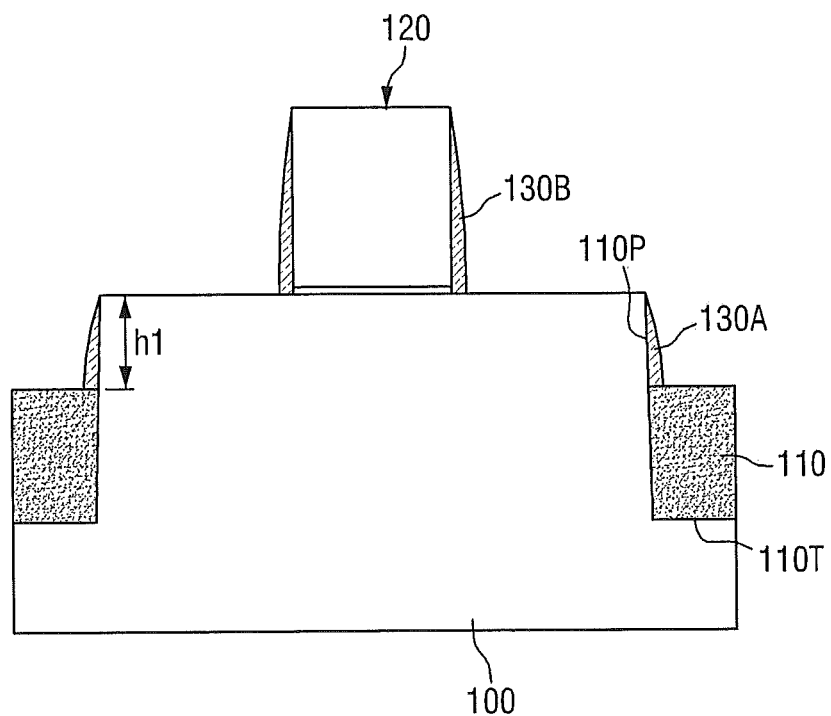

Referring to FIGS. 3 and 4, a second insulating layer 130 is formed on the substrate 100. Then, the second insulating layer 130 is etched to form a first spacer 130B on a sidewall of the gate pattern 120 and a second spacer 130A on the exposed sidewall (110P) of the first trench 110T. The first spacer 130B and the second spacer 130A may be formed simultaneously.

Referring to FIG. 3, the second insulating layer 130 may be conformally formed on the substrate 100, that is, the first region A including the gate pattern 120 and the second region B in which the portion 110P of the sidewall of the first trench 110T is exposed. The second insulating layer 130 may be an etch-resistant material. Specifically, the second insulating layer 130 may be an etch-resistant material having an etch selectivity with respect to the first insulating layer 110. A material used to etch the first insulating layer 110 may etch the second insulating layer 130 little compared with the first insulating layer 110 or may not etch the second insulating layer 130 substantially at all. To adjust the etch selectivity, the second insulating layer 130 may be made of, e.g., silicon oxide, silicon nitride, SiON, SiCN, SiOC and/or a combination of these materials. The second insulating layer 130 may be conformally formed by CVD and/or atomic layer deposition (ALD).

Referring to FIG. 4, the first spacer 130B is formed on the sidewall of the gate pattern 120, and the second spacer 130A is formed to contact the exposed sidewall of the first trench 110T and the first insulating layer 110. The first spacer 130B and the second spacer 130A are formed simultaneously. Specifically, the second insulating layer 130 of FIG. 3 is dry-etched. As a result, part of the second insulating layer 130, that is, the first spacer 130B and the second spacer 130A remain while the other part of the second insulating layer 130 is removed. The sidewall of the gate pattern 120 and the exposed sidewall of the first trench 110T may be substantially perpendicular to a bottom surface of the substrate 100. Therefore, the second insulating layer 130 may serve as a self mask on the sidewall of the gate pattern 120 and the exposed sidewall of the first trench 110T, thus leaving the first spacer 130B and the second spacer 130A.

A height of the second spacer 130A may be substantially equal to the length h1 of the exposed portion 110P of the sidewall of the first trench 110T shown in FIGS. 2A and 2B. That is, the height of the second spacer 130A may be in a range of about 10 to about 400 Å. When a semiconductor pattern is grown in each of recesses formed on both sides of the gate pattern 120 by a subsequent process, the second spacer 130A may serve as a support for the semiconductor pattern. That is, the second spacer 130A can increase a distance from the bottom surface of the substrate 100 to a start point of a facet of the semiconductor pattern.

Hereinafter, methods of fabricating a semiconductor device according to some other embodiments of the present inventive concept will be described with reference to FIGS. 5 through 11. The fabrication methods illustrated in FIGS. 5 through 11 use the substrate 100, which includes the second spacer 130A formed through the processes of FIGS. 1 through 4.

FIGS. 5 through 11 are cross-sectional views respectively illustrating processes included in methods of fabricating a semiconductor device according to some other embodiments of the present inventive concept.

Figure 5:
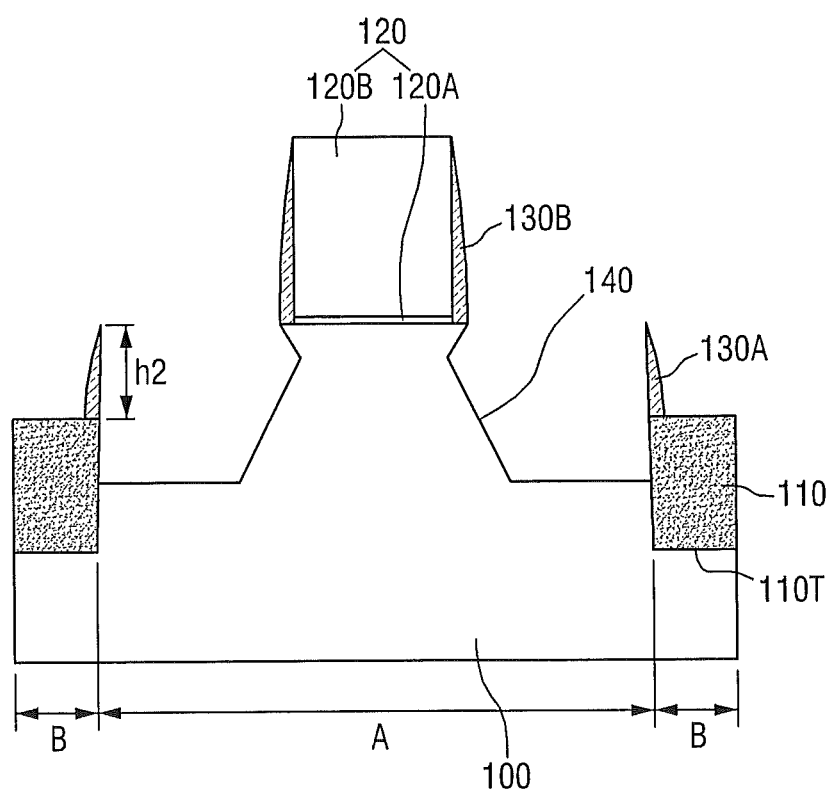
FIGS. 5 through 11 are cross-sectional views respectively illustrating processes included in methods of fabricating a semiconductor device according to some other embodiments of the present inventive concept.

Referring to FIG. 5, a second trench 140 is formed by etching the first region A on each of both sides of the gate pattern 120. That is, all or part of the first region A of the substrate 100 that is not overlapped by the gate pattern 120 is etched, thereby forming the second trench 140. The etching of the substrate 100 may be accomplished by a dry etching process and/or a wet etching process. The second trench 140 may extend from a top surface of the substrate 100 toward the bottom surface thereof.

A semiconductor pattern 150 (see FIG. 6) is formed in the second trench 140 by a subsequent process. Part of a sidewall of the second trench 140 may be recessed toward a channel region in order to maximize compressive or tensile stress applied to the substrate 100, specifically, the channel region. Accordingly, a cross section of the second trench 140 taken in a direction from the top surface of the substrate 100 toward the bottom surface thereof may be sigma (Σ)-shaped. However, the cross-sectional shape of the second trench 140 is not limited to the sigma (Σ) shape. The second trench 140 can have any cross-sectional shape as long as it can increase or maximize compressive or tensile stress that the semiconductor pattern 150 (see FIG. 6) applies to the substrate 100.

Referring to FIGS. 4 and 5, the height of the second spacer 130A after the second trench 140 is formed may be h2. The height h2 of the second spacer 130A after the second trench 140 is formed may be smaller than or substantially equal to the height h1 of the second spacer 130A before the second trench 140 is formed. Although the second spacer 130A is an etch-resistant material, it cannot be said that the second spacer 130A is not etched at all in a subsequent process. That is, since the material of the second spacer 130A can have an etch selectivity with respect to a material used to etch the substrate 100, h2 may be smaller than h1.

However, the second spacer 130A may be more etch resistant than the first insulating layer 110. That is, under conditions for forming the second trench 140 as shown in FIG. 5, the second spacer 130A may be etched less than the first insulating layer 110. Therefore, a distance from the bottom surface of the substrate 100 to the first insulating layer 110 when the second spacer 130A is not formed may be smaller than a distance from the bottom surface of the substrate 100 to a topmost point of the second spacer 130A when the second spacer 130A is formed.

Figure 6:
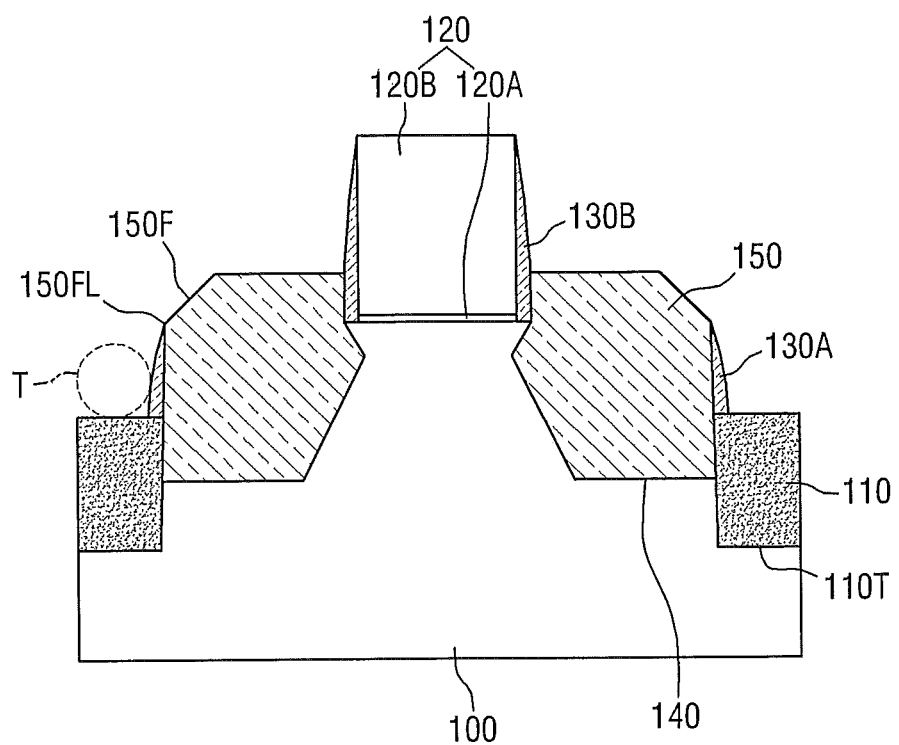

Referring to FIG. 6, the semiconductor pattern 150 is formed in the second trench 140. That is, the semiconductor pattern 150 which can apply tensile or compressive stress to the substrate 100 may be formed in the second trench 140. The semiconductor pattern 150 may be a source or drain of a transistor. The semiconductor pattern 150 may be formed by epitaxially growing a semiconductor material in the second trench 140. That is, the semiconductor pattern 150 may be a monocrystalline epitaxial layer. The semiconductor pattern 150 may be formed by, e.g., CVD or ALD.

When the semiconductor pattern 150 is designed to apply tensile or compressive stress to the substrate 100, it may be made of a material having a different lattice constant from that of the material that forms the substrate 100. When a semiconductor device is a p-type metal oxide semiconductor (PMOS) transistor, it is driven by holes. Thus, it may be desirable to apply compressive stress to the substrate 100. Accordingly, the semiconductor pattern 150 may be made of a material having a larger lattice constant than that of the material of the substrate 100. That is, when the substrate 150 is made of Si, the semiconductor pattern 150 may be made of SiGe having a larger lattice constant than that of Si of the substrate 150. When the semiconductor device is an n-type metal oxide semiconductor (NMOS) transistor, it is driven by electrons. Thus, it may be desirable to apply tensile stress to the substrate 100. Accordingly, the semiconductor pattern 150 may be made of a material having a smaller lattice constant than that of the material of the substrate 100. That is, when the substrate 100 is made of Si, the semiconductor pattern 150 may be made of SiC having a smaller lattice constant than that of Si of the substrate 150.

Referring to FIG. 6, a top surface of the semiconductor pattern 150 formed in the second trench 140 is higher than a boundary surface between the gate insulating film 120A and the substrate 100, and the semiconductor pattern 150 has a sloping facet 150F. This shape of the semiconductor pattern 150 formed in the second trench 140 is merely an example used to describe the current embodiment of the present inventive concept. As such, the shape of the semiconductor pattern 150 is not limited to this shape. The semiconductor pattern 150 grows up to the topmost point of the second spacer 130A by using the second spacer 130A as a sidewall. Then, the semiconductor pattern 150 grows using the topmost point of the second spacer 130A as a start point 150FL of the facet 150F. The semiconductor pattern 150 has the facet 150F because each material may have a preferred growth direction and thus may grow in the preferred growth direction. A distance from the start point 150FL of the facet 150F of the semiconductor pattern 150 to the bottom surface of the substrate 100 may be greater when the second spacer 130A is formed as described above than when the second spacer 130A is not formed. Effects obtained by the increased distance will be described later with reference to FIG. 11.

Figure 7:
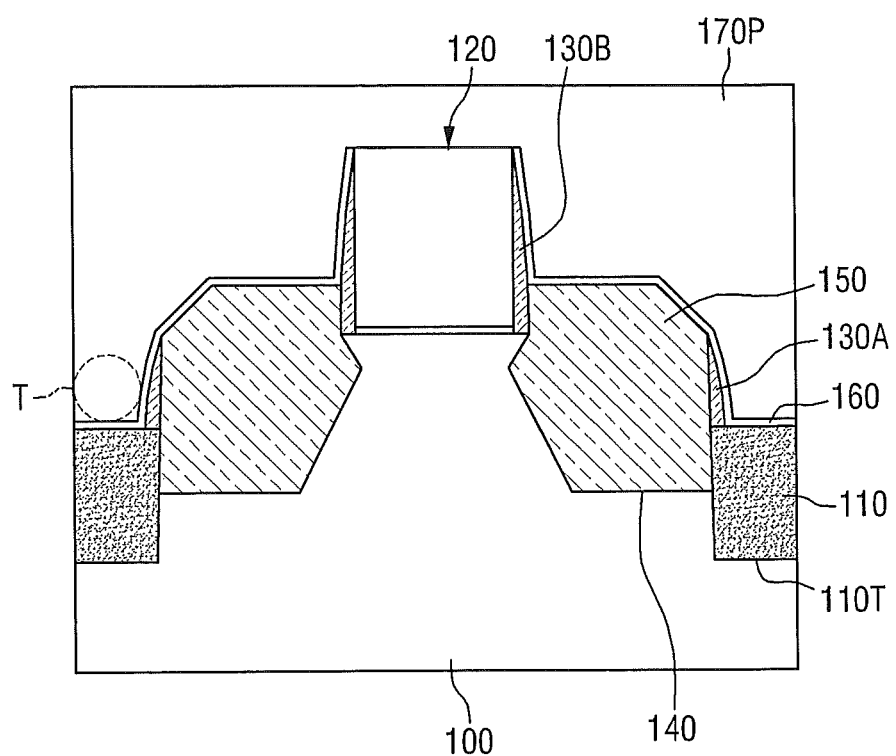

Referring to FIG. 7, an interlayer insulating layer 170P is formed on the substrate 100. A space T, which remains in the first trench 110T after part of the first insulating layer 110 is removed by the process of FIG. 2, may be completely filled with the interlayer insulating layer 170P. The interlayer insulating layer 170P may be made of, e.g., silicon oxide or a low-k material and may be doped with impurities. In addition, the interlayer insulating layer 170P may be formed by a deposition process such as high-density plasma deposition and/or CVD.

The interlayer insulating layer 170P may be formed in a single process or may be formed by a number of deposition processes. Specifically, an etch stop film 160 is formed on the substrate 100 using, e.g., a silicon nitride film, a silicon oxide film, and/or a double layer composed of the silicon nitride film and the silicon oxide film. The etch stop film 160 can be omitted depending on which process is used. Next, a first interlayer insulating layer (not shown) is formed on the etch stop film 160. The surface of the first interlayer insulating layer is planarized by chemical mechanical polishing (CMP) until the gate pattern 120 is exposed. Then, a second interlayer insulating layer is formed on the planarized first interlayer insulating layer, thereby completing the interlayer insulating layer 170P. The interlayer insulating layer 170P that substantially completely fills the space T, which remains in the first trench 110T after part of the first insulating layer 110, is removed by the process of FIG. 2A, is the first interlayer insulating layer.

Figure 8:
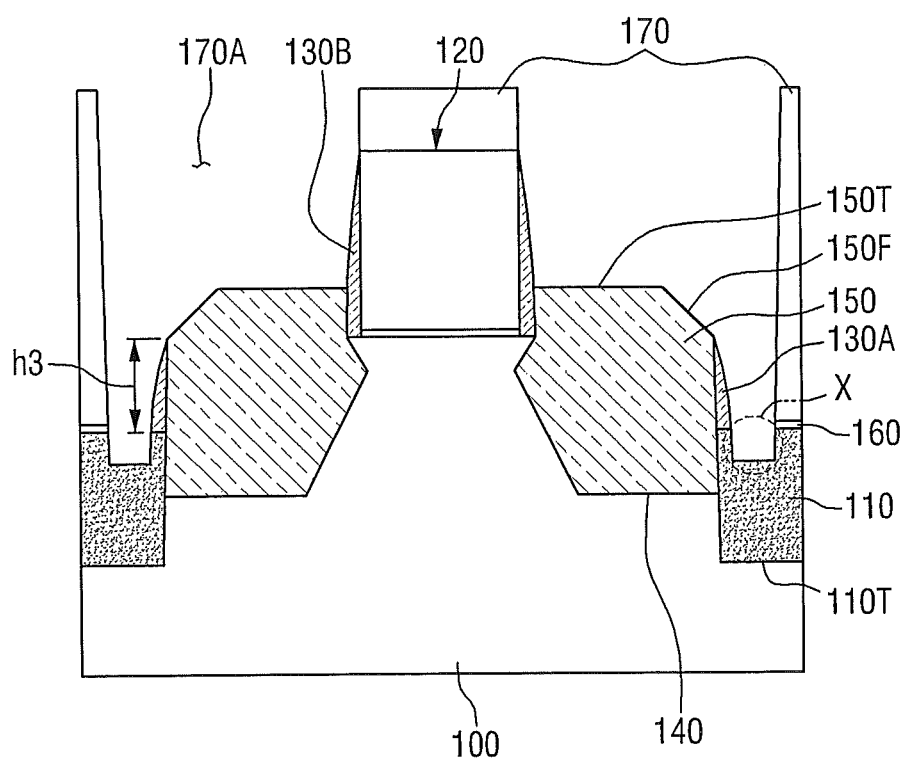

Referring to FIGS. 7 and 8, the interlayer insulating layer 170P is etched to form an interlayer insulating pattern 170 having an aperture 170A on the semiconductor pattern 150. The interlayer insulating pattern 170 may be formed by, e.g., dry-etching the interlayer insulating layer 170P. In FIG. 8, the aperture 170A of the interlayer insulating pattern 170 exposes the semiconductor pattern 150, the second spacer 130A, and the first insulating layer 110 in the first trench 110T. However, the present inventive concept is not limited thereto. That is, the aperture 170A of the interlayer insulating pattern 170 may also be formed to expose the semiconductor pattern 150 only. The aperture 170A included in the interlayer insulating pattern 170 may be used to form a contact in the semiconductor pattern 150. That is, the aperture 170A may be a contact hole.

When the interlayer insulating layer 170P is etched to form the aperture 170A, the semiconductor pattern 150, the second spacer 130A, and the first insulating layer 110 in the first trench 110T may also be etched. That is, the aperture 170A is formed in order to expose the semiconductor pattern 150 having the facet 150F and remove the etch stop film 160 formed below the aperture 170A. Here, when the interlayer insulating layer 170P is etched to form the interlayer insulating pattern 170 having the aperture 170A, the second spacer 130A and the first insulating layer 110 in the first trench 110T may also be etched due to an etch selectivity between materials. After the interlayer insulating pattern 170 having the aperture 170A is formed, the height of the second spacer 130A is h3. The height h2 of the second spacer 130A after the second trench 140 of FIG. 5 is formed may be greater than or substantially equal to h3. When the material of the second spacer 130A has a far higher etch selectivity than the material of the interlayer insulating pattern 170 or when the aperture 170A is formed only on the semiconductor pattern 150, h2 and h3 may be substantially equal. After the formation of the interlayer insulating pattern 170, a region X may be formed to a depth lower than a boundary surface between the first insulating layer 110 and the second spacer 130A. Here, the first insulating layer 110 under the second spacer 130A is not etched since the second spacer 130A serves as an etch mask.

Figure 9:
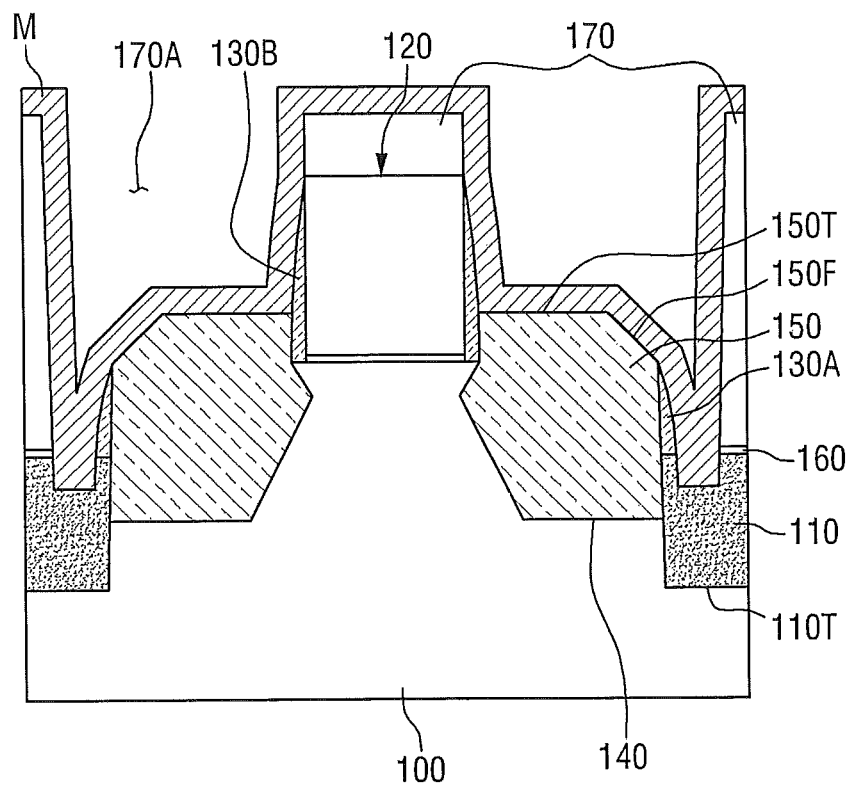
Figure 10:
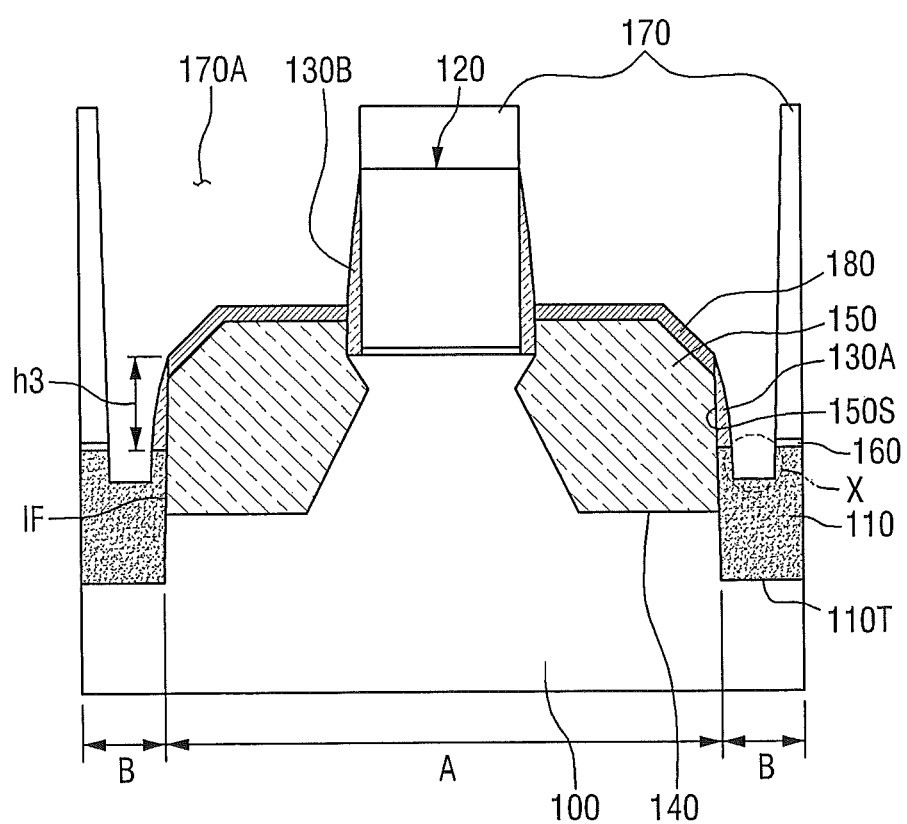

Referring to FIGS. 9 and 10, a silicide film 180 is formed on the semiconductor pattern 150. The silicide film 180 is formed in the aperture 170A. While the silicide film 180 contacts the second spacer 130A, it is separated from the first insulating layer 110. That is, the semiconductor pattern 150 and the second spacer 130A are located between the silicide film 180 and the first insulating layer 110. A boundary surface IF between the first insulating layer 110 of the second region B and the semiconductor pattern 150 of the first region A do not directly contact the silicide film 180. In addition, the silicide film 180 is not formed on a sidewall 150S of the semiconductor pattern 150. That is, the second spacer 130A and the first insulating layer 110 under the second spacer 130A prevent the silicide film 180 from being formed on the sidewall 150S of the semiconductor pattern 150.

Referring to FIG. 9, a metal layer M is deposited on the interlayer insulating pattern 170. The metal layer M may be a precursor material for forming the silicide film 180 and may include any one or a combination of Ni, Pt, Ti, Ru, Rh, Co, Hf, Ta, Er, Yb, and W. The metal layer M may be formed by physical vapor deposition (PVD), CVD, or ALD. A thickness of the metal layer M may be determined in view of a thickness of the semiconductor pattern 150 under the metal layer M, which is consumed by heat treatment. For example, the metal layer M may be formed to a thickness that does not completely consume the semiconductor pattern 150.

Referring to FIG. 10, the silicide film 180 is formed on the semiconductor pattern 150 by heat-treating the metal layer M. The heat treatment process causes metal contained in the metal layer M to permeate into the semiconductor pattern 150, which contacts the metal layer M. This triggers a silicide reaction, resulting in the formation of the silicide film 180 on the semiconductor pattern 150. An unreacted portion of the metal layer M is removed by an etching or cleaning process.

Then, the silicide film 180 formed on the semiconductor pattern 150 may be heat-treated. However, the present inventive concept is not limited thereto.

Figure 11:
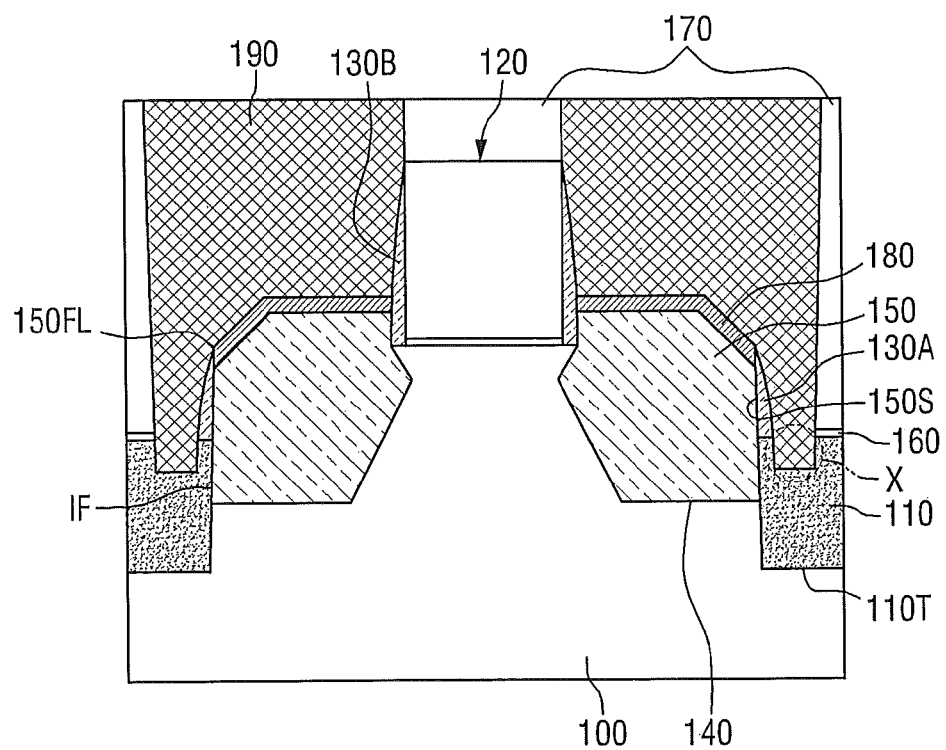

Referring to FIG. 11, a contact 190 is formed by filling the aperture 170A of the interlayer insulating pattern 170. The contact 190 is connected to the semiconductor pattern 150 by the silicide film 180. The contact 190 is also formed on the second spacer 130A and the first insulating layer 110 in the first trench 110T, but may not substantially affect the operation of the semiconductor device. The contact 190 may be made of a metal and/or conductive material, specifically, for example, tungsten.

A semiconductor device fabricated using the fabrication methods according to some embodiments of the present inventive concept provides the following effects.

Referring to FIG. 11, the volume of the semiconductor pattern 150 may be greater when the semiconductor pattern 150 is grown using the second spacer 130A as a sidewall than when grown without the second spacer 130A. The increased volume of the semiconductor pattern 150, which is made of a material having a different lattice constant from the material of the substrate 100, can improve characteristics of the semiconductor device. That is, an increase in the volume of the semiconductor pattern 150 may result in an increase in stress acting on the substrate 100, specifically, the channel region. The increased tensile or compressive stress may increase the mobility of carriers that operate the semiconductor device. Increased mobility of the carriers may increase the operation speed of the semiconductor device, thereby improving the performance of the semiconductor device.

Specifically, the distance from the bottom surface of the substrate 100 to the start point 150FL of the facet 150F of the semiconductor pattern 150 is greater when the second spacer 130A is formed than when the second spacer 130A is not formed, as described above with reference to FIG. 5. Therefore, even if the height of the semiconductor pattern 150 remains unchanged, the volume of the semiconductor pattern 150 may be greater when the second spacer 130A is formed than when the second spacer 130A is not formed.

As described above, the start point 150FL of the facet 150F of the semiconductor pattern 150 is higher when the second spacer 130A is formed than when the second spacer 130A is not formed. That is, since the silicide film 180 is formed on the semiconductor pattern 150, a distance from a junction (not shown) of the semiconductor device to the silicide film 180 is greater when the second spacer 130A is formed. Therefore, a junction voltage of the semiconductor device may be increased by an amount corresponding to a distance by which the start point 150FL of the facet 150F of the semiconductor pattern 150 is raised by the formation of the second spacer 130A. The increased junction voltage may reduce junction leakage, thereby improving the reliability of the semiconductor device.

Referring to FIG. 11, the silicide film 180 contacts the second spacer 130 but is separated from the first insulating layer 110. The silicide film 180 does not directly contact the boundary surface IF between the semiconductor pattern 150 and the first insulating layer 110 in the first trench 110T. In addition, when the contact hole is formed, the first insulating layer 110 is etched further, thus forming the region X, which extends toward the bottom surface of the substrate 100. Meanwhile, the second spacer 130A and the first insulating layer 110 under the second spacer 130A may prevent the silicide film 180 from being formed on the sidewall 150S of the semiconductor pattern 150. That is, a leakage current passage formed at a boundary between the semiconductor pattern 150 and the substrate 100 and the first insulating layer 110 may not directly contact the silicide film 180. This may reduce the leakage current of the semiconductor device, thus improving the operation reliability of the semiconductor device.

Figure 12:
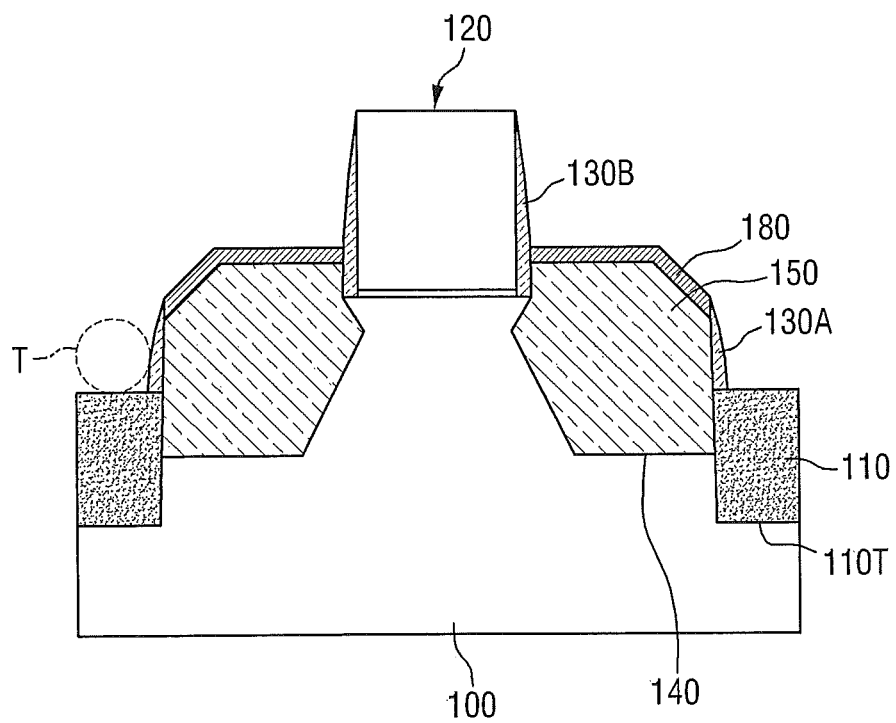
FIGS. 12 and 13 are cross-sectional views respectively illustrating processes included in methods of fabricating a semiconductor device according to some other embodiments of the present inventive concept.
Figure 13:
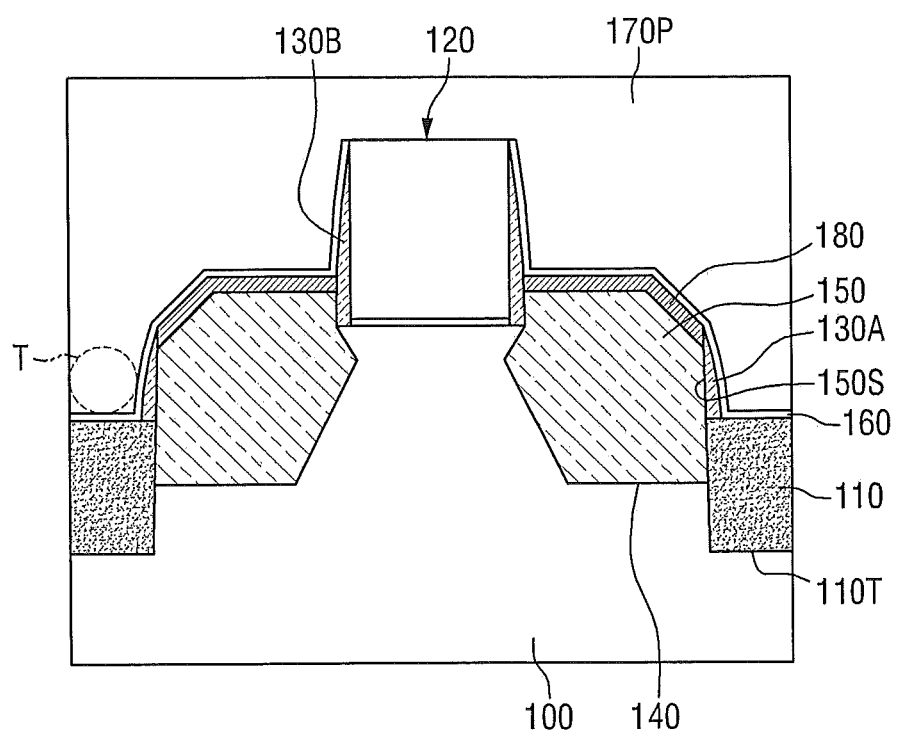

Hereinafter, methods of fabricating a semiconductor device according to some other embodiments of the present inventive concept will be described with reference to FIGS. 1 through 6 and 11 through 13. FIGS. 12 and 13 are cross-sectional views respectively illustrating processes included in methods of fabricating a semiconductor device according to some other embodiments of the present inventive concept.

For simplicity, any repetitive description of the same processes as those of the methods of fabricating a semiconductor device according to previous embodiments of FIGS. 1 through 11 will be omitted or simplified.

Referring to FIGS. 1 through 4, a substrate 100 having a second spacer 130A is provided.

Referring to FIGS. 5 and 6, a second trench 140 is formed by etching each of both sides of a gate pattern 120. A semiconductor pattern 150 is formed in the second trench 140. A top surface of the semiconductor pattern 150 may be higher than a boundary between a gate insulating film 120A and the substrate 100. However, the present inventive concept is not limited thereto. The semiconductor pattern 150 may be made of a material having a different lattice constant from that of the material of the substrate 100.

Referring to FIG. 12, a silicide film 180 is formed on the semiconductor pattern 150. Specifically, a metal layer (not shown) may be formed on the semiconductor pattern 150. The metal layer is heat-treated, thus triggering a silicide reaction between the semiconductor pattern 150 and the metal layer. As a result of the heat treatment process, the silicide film 180 is formed on the semiconductor pattern 150, and an unreacted portion of the metal layer is removed by an etching or cleaning process.

Referring to FIG. 13, an interlayer insulating layer 170P is formed on the substrate 100. The interlayer insulating layer 170P may completely fill a space T which remains in a first trench 110T after part of a first insulating layer is removed by the process of FIG. 2A. The interlayer insulating layer 170P may be formed at a time but may also be formed by a number of deposition processes. Specifically, an etch stop film 160 is formed on the substrate 100. The etch stop film 160 can be omitted depending on a process. A first interlayer insulating layer may be formed on the etch stop film 160 and then planarized by CMP until the gate pattern 120 is exposed. A second interlayer insulating layer is formed on the planarized first interlayer insulating layer, thereby forming the interlayer insulating layer 170P.

Referring to FIG. 11, the interlayer insulating layer 170P is etched to form an interlayer insulating pattern 170 having an aperture on the silicide film 180. A contact 190 is formed by filling the aperture of the interlayer insulating pattern 170. The contact may be made of tungsten and may be connected to an interlayer wiring (not shown).

Hereinafter, methods of fabricating a semiconductor device according to some other embodiments of the present inventive concept will be described with reference to FIGS. 1, 7 through 11, and 14 through 17. FIGS. 14 through 17 are cross-sectional views respectively illustrating processes included in methods of fabricating a semiconductor device according to some other embodiments of the present inventive concept.

For simplicity, any repetitive description of the same processes as those of methods of fabricating a semiconductor device according to previous embodiments of FIGS. 1 through 11 will be omitted or simplified.

Figure 14:
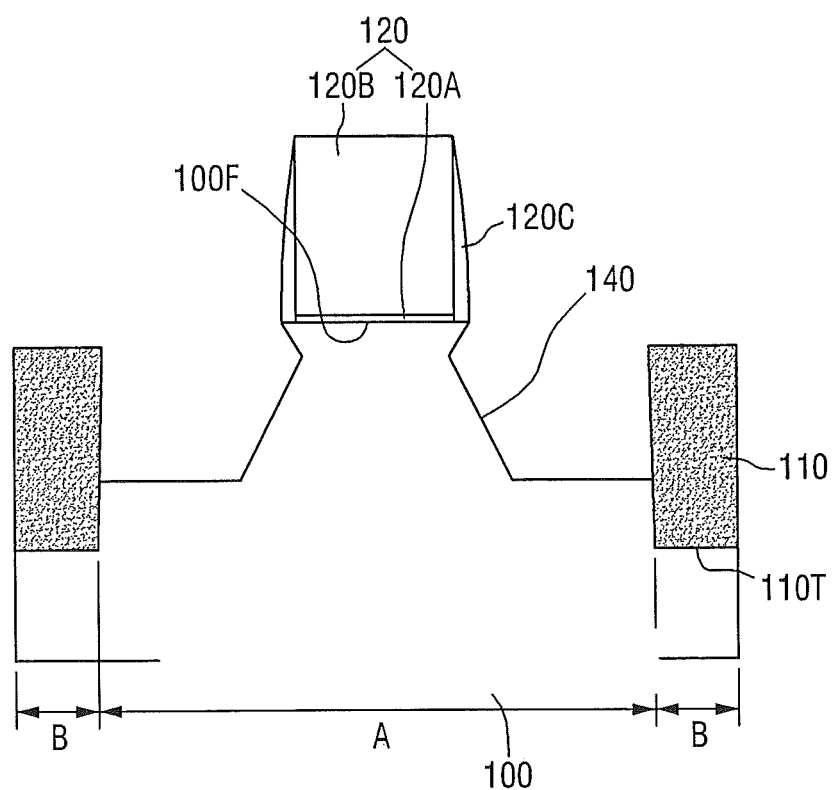
FIGS. 14 through 17 are cross-sectional views respectively illustrating processes included in methods of fabricating a semiconductor device according to some other embodiments of the present inventive concept.

Referring to FIGS. 1 and 14, a second trench 140 is formed by etching a first region A on each of both sides of a gate pattern 120. The second trench 140 extending from a top surface of a substrate 100 toward a bottom surface thereof is formed by a dry etching process or a wet etching process.

Specifically, the gate pattern 120 may include a gate insulating film 120A, a gate electrode 120B, and a gate spacer 120C. The gate spacer 120C may include a nitride film and/or an oxide film and may be deposited by CVD. However, the present inventive concept is not limited thereto. To improve the performance of a semiconductor device, part of a sidewall of the second trench 140 may be recessed toward under the gate spacer 120C. While the second trench 140 is being formed, a first insulating layer 110 of a second region B may also be etched.

Figure 15:
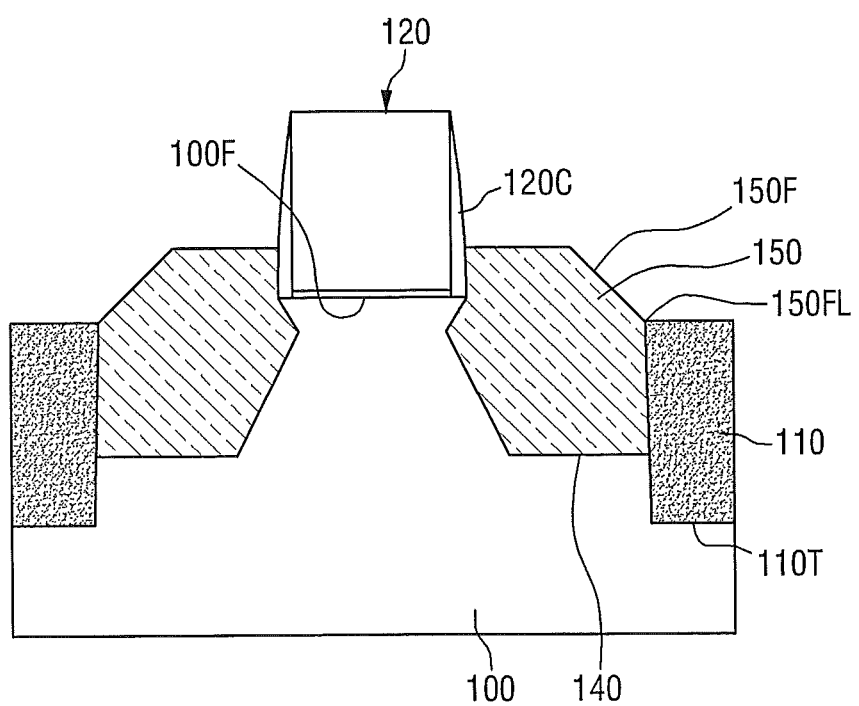

Referring to FIG. 15, a semiconductor pattern 150 is formed in the second trench 140. The semiconductor pattern 150 may be formed by epitaxially growing a semiconductor material in the second trench 140. A top surface of the semiconductor pattern 150 may be higher than a boundary surface 100F between the gate pattern 120 and the substrate 100. However, the present inventive concept is not limited thereto. When the top surface of the semiconductor pattern 150 is formed higher than the boundary surface 100F between the gate pattern 120 and the substrate 100, the semiconductor pattern 150 may surround part of a sidewall of the gate spacer 120C. In the second trench 140, the semiconductor pattern 150 grows using the first insulating layer 110 as a sidewall. From a point (150FL) at which the first insulating layer 110 does not exist, the semiconductor pattern 150 grows while forming a facet 150F. If the first insulating layer 110 is etched in the process of FIG. 14, a start point 150FL of the facet 150F of the semiconductor pattern 150 may be lower than the boundary surface 100F between the gate pattern 120 and the substrate 100.

Figure 16:
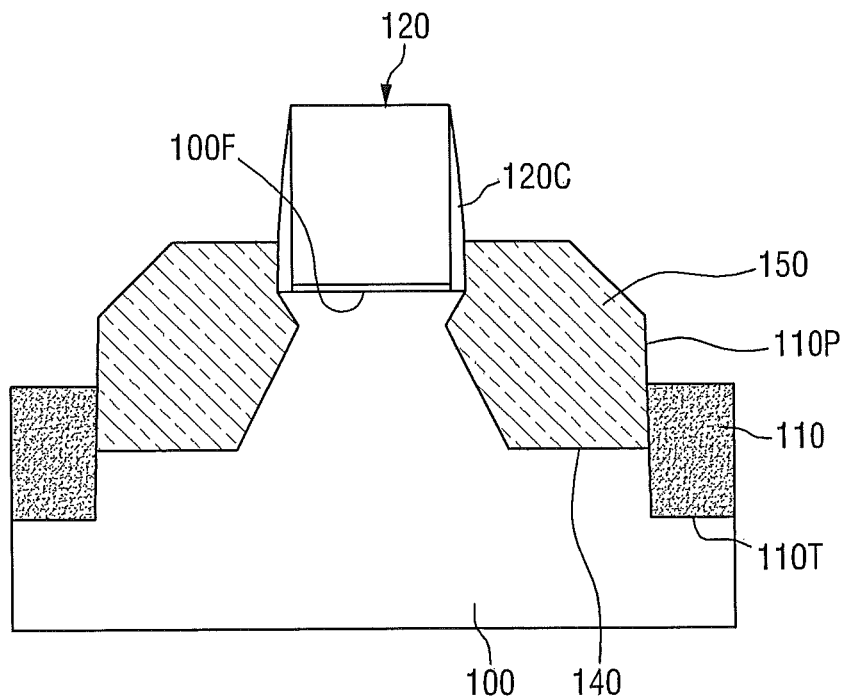

Referring to FIG. 16, part of the first insulating layer 110 in a first trench 110T is etched, thereby exposing a portion 110P of a sidewall of the first trench 110T. The removal of part of the first insulating layer 110 exposes a portion of a sidewall of the semiconductor pattern 150, unlike in the case of FIGS. 2A and 2B.

Figure 17:
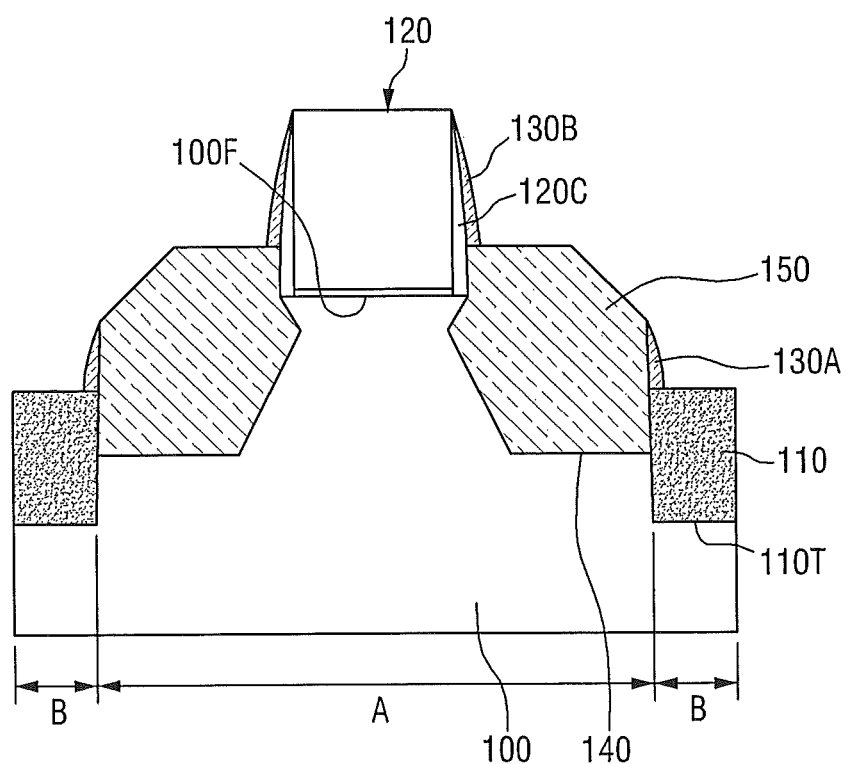

Referring to FIG. 17, a first spacer 130B is formed on a sidewall of the gate pattern 120, and a second spacer 130A is formed on the exposed sidewall 110P of the first trench 110T. The first spacer 130B and the second spacer 130A may be formed simultaneously. Specifically, the first spacer 130B is formed on the sidewall of the gate spacer 120C and the semiconductor pattern 150. The second spacer 130A is formed on the sidewall of the semiconductor pattern 150 and the first insulating layer 110.

Specifically, a second insulating layer (not shown) may be conformally formed on the substrate 100, that is, the first region A including the gate pattern 120 and the second region B in which the portion 110P of the sidewall of the first trench 110T is exposed. The second insulating layer is removed by etching the second insulating layer excluding the first spacer 130B on the sidewall of the gate spacer 120C and the second spacer 130A on the exposed sidewall 110P of the first trench 110T.

Referring to FIGS. 7 through 11, an interlayer insulating pattern 170 having an aperture 170A on the semiconductor pattern 150 is formed A silicide film 180 is formed in the aperture 170A, and the aperture 170A is filled with a contact material, thereby forming a contact 190 on the silicide film 180.

A semiconductor device fabricated using the fabrication methods of FIGS. 14 through 17 may provide the following effects.

Since the semiconductor pattern 150 is formed before the second spacer 130A, improvements in characteristics of the semiconductor device resulting from an increase in the volume of the semiconductor pattern 150 cannot be expected. However, the second spacer 130A, which is more etch resistant than the first insulating layer 110, is formed on the exposed sidewall of the first trench 110T. Thus, the second spacer 130A is etched less than the first insulating layer 110 by an etching process for forming a contact. That is, a distance from a bottom surface of the substrate 100 to the start point 150FL of the facet 150F of the semiconductor pattern 150 may be greater when the second spacer 130A is formed than when the second spacer 130A is not formed. Therefore, a junction voltage of the semiconductor device may be increased by an amount corresponding to a distance by which the start point 150FL of the facet 150F of the semiconductor pattern 150 is raised by the formation of the second spacer 130A. The increased junction voltage may reduce junction leakage and thus may improve the reliability of the semiconductor device.

Furthermore, the silicide film 180 contacts the second spacer 130A but is separated from the first insulating layer 110. The silicide film 180 does not directly contact a boundary between the semiconductor pattern 150 and the first insulating layer 110 in the first trench 110T. That is, a leakage current passage formed at a boundary between the semiconductor pattern 150 and the substrate 100 and the first insulating layer 110 may not directly contact the silicide film 180. This can improve the operation reliability of the semiconductor device.

In concluding the detailed description, those skilled in the art will appreciate that many variations and modifications can be made to the described embodiments without substantially departing from the principles of the present inventive concept. Therefore, the disclosed embodiments of the inventive concept are used in a generic and descriptive sense only and not for purposes of limitation.

What is claimed is:

1. A method of fabricating a semiconductor device, the method comprising:
   providing a substrate which comprises a first region having a gate pattern and a second region having a first trench and a first insulating layer which fills the first trench;
   exposing a portion of a sidewall of the first trench by etching part of the first insulating layer;
   forming a second insulating layer on the substrate and forming a first spacer on a sidewall of the gate pattern and a second spacer on the exposed sidewall of the first trench by etching the second insulating layer, the first spacer and the second spacer being formed substantially simultaneously;
   forming a second trench by etching the first region on each of both sides of the gate pattern;
   forming a semiconductor pattern in the second trench;
   forming an interlayer insulating layer on the substrate; and
   forming an interlayer insulating pattern having an aperture on the semiconductor pattern by etching the interlayer insulating layer,
   wherein after forming the interlayer insulating pattern, the aperture includes a region that is formed to a depth that is lower than a boundary surface between the first insulating layer and the second spacer.

2. The method according to claim 1, wherein the second spacer is an etch-resistant material having an etch selectivity with respect to the first insulating layer.

3. The method according to claim 1, wherein a height of the exposed portion of the sidewall of the first trench is in a range of 10 to 400 Å.

4. The method according to claim 1, wherein exposing the portion of the sidewall of the first trench further comprises forming a dent in the first insulating layer that contacts the first region.

5. The method according to claim 1, wherein a top surface of the first insulating layer is substantially flat after the portion of the sidewall of the first trench is exposed.

6. The method according to claim 1, further comprising:
   forming a silicide film on the semiconductor pattern that contacts the second spacer and is separated from the first insulating layer.

7. The method according to claim 6,
   wherein forming the silicide film comprises forming the silicide film in the aperture.

8. The method according to claim 7, wherein the interlayer insulating layer is formed to substantially fill the first trench.

9. The method according to claim 6, further comprising forming an interlayer insulating pattern having an aperture on the silicide film, wherein a contact is formed in the aperture.

10. The method according to claim 6, wherein the semiconductor pattern is a monocrystalline epitaxial layer.

11. The method according to claim 6, wherein the semiconductor pattern includes a first material that includes a first lattice constant and the substrate includes a second material that includes a second lattice constant that is different from the first lattice constant.

12. The method according to claim 11, wherein the substrate is a silicon substrate, and the semiconductor pattern is one of SiGe and/or SiC.

13. The method according to claim 6, wherein a boundary surface between the semiconductor pattern and the first insulating layer does not contact the silicide film.

14. A method of fabricating a semiconductor device, the method comprising:
   providing a substrate that comprises a first region having a gate pattern and a second region having a first trench and a first insulating layer which fills the first trench;
   exposing a portion of a sidewall of the first trench by etching part of the insulating layer;
   forming a first spacer on a sidewall of the gate pattern and forming a second spacer on the exposed sidewall of the first trench;
   forming a second trench by etching the first region on each of both sides of the gate pattern;
   forming a semiconductor pattern in the second trench;
   forming an interlayer insulating layer on the substrate;
   forming an interlayer insulating pattern having an aperture on the semiconductor pattern by etching the interlayer insulating layer,
   wherein after forming the interlayer insulating pattern, the aperture includes a region that is formed to a depth that is lower than a boundary surface between the first insulating layer and the second spacer.

15. The method according to claim 14, further comprising forming a silicide film on the semiconductor pattern.

16. The method according to claim 15, wherein the silicide film contacts the second spacer and is separated from the insulating layer.

17. The method according to claim 15, wherein the interlayer insulating layer is formed to completely fill the first trench.

18. The method according to claim 16,
wherein the interlayer insulating layer is formed to completely fill the first trench, and
wherein a boundary surface between the semiconductor pattern and the insulating layer does not contact the silicide film.

19. The method according to claim 14, wherein the second spacer is an etch-resistant material having an etch selectivity with respect to the insulating layer.

20. The method according to claim 19, wherein the etch-resistant material is one of SiN, SiON, SiCN, and a combination of these materials.

* * * * *